United States Patent [19]

Takahashi

[11] Patent Number: 5,584,963
[45] Date of Patent: Dec. 17, 1996

[54] SEMICONDUCTOR DEVICE MANUFACTURING APPARATUS AND CLEANING METHOD FOR THE APPARATUS

[75] Inventor: Hironari Takahashi, Itami, Japan

[73] Assignee: Mitsubishi Denki Kabushiki Kaisha, Tokyo, Japan

[21] Appl. No.: 522,159

[22] Filed: Sep. 14, 1995

Related U.S. Application Data

[63] Continuation of Ser. No. 245,034, May 17, 1994, abandoned.

[30] Foreign Application Priority Data

May 18, 1993 [JP] Japan ................... 5-115898

[51] Int. Cl.$^6$ ............... H01L 21/00; B44C 1/22
[52] U.S. Cl. ................ 156/646.1; 156/657.1; 156/345; 134/22.1; 134/31
[58] Field of Search ............ 156/646.1, 643.1, 156/657.1, 662.1, 345 P; 134/1, 31, 22.1, 37, 42, 22.11

[56] References Cited

U.S. PATENT DOCUMENTS

| | | | |
|---|---|---|---|
| 4,749,440 | 6/1988 | Blackwood et al. | 156/646 |
| 5,294,262 | 3/1994 | Nishimura | 134/31 X |
| 5,336,356 | 8/1994 | Ban et al. | 156/345 |

FOREIGN PATENT DOCUMENTS

| | | |
|---|---|---|
| 209485 | 5/1994 | Germany . |
| 60-220138 | 11/1985 | Japan . |
| 62-1873 | 1/1987 | Japan . |
| 63-176475 | 7/1988 | Japan . |
| 117857 | 1/1989 | Japan . |
| 1116080 | 5/1989 | Japan . |
| 1587722 | 6/1989 | Japan . |
| 394059 | 4/1991 | Japan . |

*Primary Examiner*—William Powell
*Attorney, Agent, or Firm*—Leydig, Voit & Mayer

[57] ABSTRACT

In a semiconductor device manufacturing apparatus for forming silicon oxide films on semiconductor wafers by reduced-pressure CVD, anhydrous HF gas and an interhalogen compound gas are introduced along with a carrier gas to a reaction chamber or a vacuum evacuation pipe. The anhydrous HF gas and the interhalogen compound gas react with deposits adhering to an inner wall of the reaction chamber and the vacuum evacuation pipe so that the deposits are decomposed into gases and removed. Particles attributable to the deposits are prevented from adhering to the semiconductor wafers.

5 Claims, 5 Drawing Sheets

5,584,963

SEMICONDUCTOR DEVICE MANUFACTURING APPARATUS AND CLEANING METHOD FOR THE APPARATUS

This disclosure is a continuation of patent application Ser. No. 08/245,034, filed May 17, 1994, now abandoned.

FIELD OF THE INVENTION

The present invention relates to a semiconductor device manufacturing apparatus and a cleaning method for the apparatus, and, more particularly, to a silicon oxide film forming apparatus for use in the process of manufacturing semiconductor devices and to a method of cleaning the apparatus.

DESCRIPTION OF THE RELATED ART

In conventional semiconductor device manufacturing apparatus, e.g., reduced-pressure CVD apparatus, oxide films have been formed on semiconductor wafers at a temperature of approximately 850° C. using $SiH_4$ gas and $N_2O$ (binitrogen monoxide) gas, for example. For a higher degree of integration in VLSI (Very Large Scale Integrated Circuits) and an improvement in productivity, however, a process using TEOS (tetraethylorthosilicate) gas is becoming more popular for achieving a reduction in the heat-treatment temperature and to deal with a larger number of semiconductor wafers processed at one time in the step of forming oxide films.

FIG. 6 is a block diagram showing a conventional reduced-pressure CVD apparatus for forming oxide films using TEOS gas. In the figure, a plurality of semiconductor wafers, e.g., silicon wafers 1, on which oxide films are to be formed are placed on a quartz boat 2, and the quartz boat 2 is placed in a reaction chamber, e.g., a quartz tube 3. A heater 4 for heating is disposed around the quartz tube 3.

TEOS gas is supplied from a TEOS gas supply source 5 and is introduced to the quartz tube 3 from a vacuum flange 8 at one end through a mass flow controller 6 for flow rate control and a valve 7, e.g., an air-operated valve.

A carrier gas for the TEOS gas nitrogen. The nitrogen gas is supplied from a nitrogen gas supply source 9, e.g., a nitrogen bomb, and is introduced to the quartz tube 3 along with the TEOS gas through a mass flow controller 10 and a valve 11. A vacuum flange 12 is provided at the other end of the quartz tube 3, and a vacuum pump, e.g., a rotary pump 14, is connected to the vacuum flange 12 through a vacuum evacuation pipe 13. Further, the vacuum evacuation pipe 13 is provided with a vacuum evacuation main valve 15 and a vacuum evacuation sub-valve 16.

In the conventional reduced-pressure CVD apparatus constructed as above, when oxide films are formed on the silicon wafers 1 by the reduced-pressure CVD method using TEOS gas, the quartz boat 2 holding the silicon wafers 1 thereon is first set in the quartz tube 3 at atmospheric pressure. Then, to create a vacuum condition in the quartz tube 3, the rotary pump 14 is operated and the vacuum evacuation sub-valve 16 is opened to gradually evacuate air from the interior of the quartz tube 3 to 20 Torr. This is because if a vacuum is quickly drawn, particles residing within the quartz tube 3 would be stirred up and cling to the silicon wafers 1 such that patterns formed on the silicon wafers 1 may be damaged.

When the vacuum level in the quartz tube 3 exceeds 20 Torr, the vacuum evacuation main valve 15 is opened. Then, when the vacuum level in the quartz tube 3 reaches $10^{-3}$ Torr, the TEOS gas and the nitrogen gas are introduced to the quartz tube 3. The TEOS gas is fed from the TEOS gas supply source 5 at a flow rate, e.g., 80 cc/min, through the mass flow controller 6 and the nitrogen gas is fed from the nitrogen gas supply source 9 at a flow rate, e.g., 100 cc/min, through the mass flow controller 10, both of the gases being introduced to the quartz tube 3 via the vacuum flange 8. The interior of the quartz tube 3 is controlled so as to maintain a pressure of 0.8 Torr with the rotary pump 14 and a temperature of 700° C., with the heater 4. Under this condition, silicon oxide films are formed on the silicon wafers 1 by pyrolysis of the TEOS gas.

The above reduced-pressure CVD apparatus has the problem that the TEOS gas is decomposed to produce deposits such as silicon oxide films which adhere to an inner wall surface of the quartz tube 3 and are responsible for generation of particles. A large part of the TEOS gas introduced is exhausted as non-reacted gas through the vacuum evacuation pipe 13. Therefore, the TEOS gas having passed through the quartz tube 3 kept at a high temperature is cooled in the vacuum flange 12 and the vacuum evacuation pipe 13 which are not heated, thereby producing deposits on inner wall surfaces of the vacuum flange 12 and the vacuum evacuation pipe 13. These deposits, which are thought of as a substance expressed by $CH_{3.8}Si_2O_{1.7}$, for example, are stirred up in the form of particles and may adhere to surfaces of the silicon wafers 1 when the pressure in the apparatus is varied from atmospheric pressure to a vacuum or vice versa in the process of forming oxide films on the silicon wafers 1. The particles of the deposits adhering to the surfaces of the silicon wafers 1 may deteriorate reliability of VLSI.

Further, the deposits accumulated in the vacuum evacuation pipe 13 have been conventionally removed by disassembling the vacuum evacuation pipe 13 from the apparatus and washing it with water, hydrafluoric acid or the like. However, the deposits are peeled off from the pipe and generate the particles when the vacuum evacuation pipe 13 is disassembled, so that the operation of cleaning the vacuum evacuation pipe 13 must be performed frequently, e.g., once a week, and hence the cleaning operation takes labor and time.

SUMMARY OF THE INVENTION

With a view of solving the above-described problems in the prior art, an object of the present invention is to provide a semiconductor device manufacturing apparatus which can remove deposits adhering to inner walls of a reaction chamber and a vacuum evacuation pipe of the apparatus and can manufacture semiconductor devices with high reliability, and a method of cleaning the semiconductor device manufacturing apparatus.

To achieve the above object, the present invention provides a semiconductor device manufacturing apparatus comprising a reaction chamber for accommodating semiconductor wafers, reactive gas introducing means connected to the reaction chamber for introducing reactive gas to the reaction chamber, a vacuum evacuation pipe connected to the reaction chamber, vacuum evacuation means connected to the vacuum evacuation pipe for evacuating the reaction chamber and the vacuum evacuation pipe, anhydrous HF gas introducing means connected to at least one of the reaction chamber and the vacuum evacuation pipe for introducing anhydrous HF gas to the reaction chamber or the vacuum evacuation pipe, interhalogen compound gas introducing means connected to at least one of the reaction chamber and the vacuum evacuation pipe for introducing an interhalogen compound gas to the reaction chamber or the vacuum evacuation pipe, and carrier gas introducing means connected to at least one of the reaction chamber and the vacuum evacuation pipe for introducing a carrier gas to the reaction chamber or the vacuum evacuation pipe.

To achieve the above object, the present invention also provides a method of cleaning a semiconductor device manufacturing apparatus, wherein anhydrous HF gas, an interhalogen compound gas and a carrier gas are introduced to a reaction chamber for accommodating semiconductor wafers or to a vacuum evacuation pipe connected to the reaction chamber, thereby removing deposits produced by reactive gases and adhering to an inner wall of the reaction chamber or the vacuum evacuation pipe.

DETAILED DESCRIPTION OF THE PREFERRED EMBODIMENTS

Embodiment 1

Figure 1:
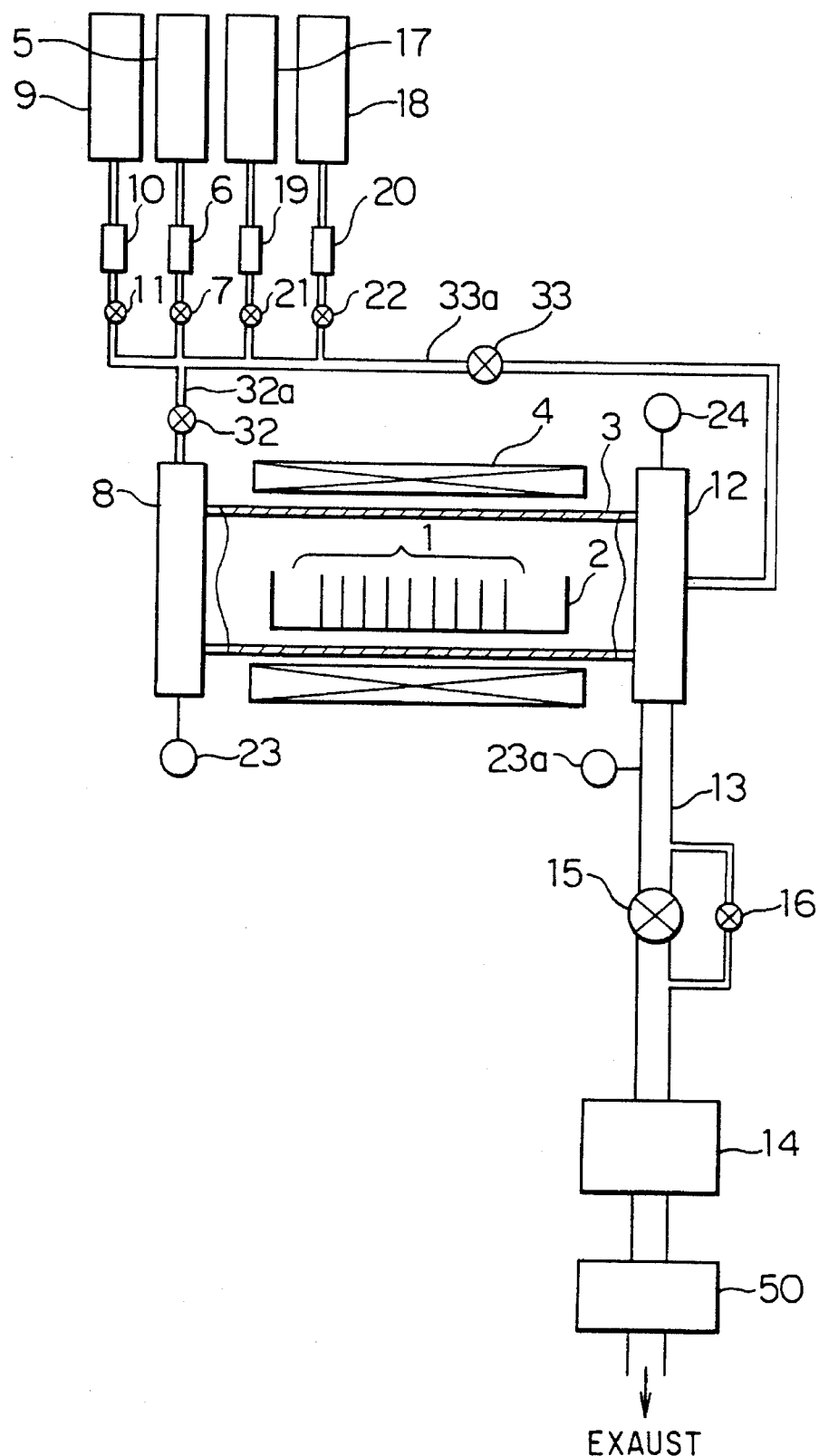
FIG. 1 is a block diagram showing a reduced-pressure CVD apparatus according to Embodiments 1 and 3 of the present invention.

FIG. 1 is a block diagram of a semiconductor device manufacturing apparatus, e.g., a reduced-pressure CVD apparatus, according to Embodiment 1 of the present invention. Note that the same reference numerals in respective figures denote the same or identical parts. Referring to FIG. 1, a reaction chamber of the reduced-pressure CVD apparatus comprises a quartz tube 3 and vacuum flanges 8 and 12 provided at ends of the quartz tube 3. A plurality of silicon wafers 1 placed on a quartz boat 2 are accommodated in the quartz tube 3. Connected to the vacuum flange 8 at one end of the quartz tube 3 are a nitrogen gas supply source 9, a TEOS gas supply source 5, an anhydrous HF gas supply source 17 and a ClF₃ gas supply source 18 through a valve 32. Carrier gas introducing means comprises the nitrogen gas supply source 9, a mass flow con,roller 10, valves 11, 32, and 33, and pipes 32a and 33a. Reactive gas introducing means comprises the TEOS gas supply source 5, a mass flow controller 6, valves 7 and 32, and the pipe 32a.

Gases for cleaning the reduced-pressure CVD apparatus are anhydrous HF gas and an interhalogen compound gas, e.g., ClF₃. Flow rate adjustment and start/stop of the introduction of these gases are controlled respectively by mass flow controllers 19 and 20 and valves 21 and 22, e.g., air-operated valves. Anhydrous HF gas introducing means comprises the anhydrous HF gas supply source 17, the mass flow controller 19, valves 21, 32 and 33, and the pipes 32a and 33a. Interhalogen compound gas introducing means comprises the ClF₃ gas supply source 18, the mass flow controller 20, the valves 22, 32 and 33, and the pipes 32a and 33a.

Connected to the vacuum flange 12 at the other end of the quartz tube 3 is a vacuum evacuation pipe 13 which is connected to a rotary pump 14 as vacuum evacuation means through a vacuum evacuation main valve 15. The vacuum evacuation pipe 13 is provided with a vacuum gauge 23a for measuring pressure in the pipe, and a noxious gas recovering device 50 is disposed downstream of the rotary pump 14 for recovering noxious gases such as anhydrous HF gas. Further, the vacuum flange 8 is provided with a vacuum gauge 23 for measuring the vacuum level in the quartz tube 3, and the vacuum flange 12 is provided with a gas sensor 24 for sensing the anhydrous HF gas and the ClF₃ gas.

In the reduced-pressure CVD apparatus constructed as above, silicon oxide films are formed on the silicon wafers 1 in a like manner to the conventional apparatus. More specifically, the nitrogen gas and the TEOS gas introduced from the nitrogen gas supply source 9 and the TEOS supply source 5 to the quartz tube 3 at predetermined flow rates, respectively, are controlled by the rotary pump 14 to have a pressure of approximately 0.8 Torr, and the interior of the quartz tube 3 is heated by a heater 4 to maintain a temperature of approximately 700° C. Under this condition, silicon oxide films are formed on the silicon wafers 1 disposed in the quartz tube 3 by pyrolysis of the TEOS gas.

In the above process, since an inner wall of the quartz tube 3 is heated by the heater 4, the silicon oxide films produced by pyrolysis of the TEOS gas also adhere to the inner wall of the quartz tube 3. The silicon oxide films adhering to the inner wall of the quartz tube 3 are not desired for the reason that they are responsible for generation of particles, as described before. Also, a large part of the TEOS gas is exhausted as non-reacted gas through the vacuum evacuation pipe 13. However, the non-reacted gas is quickly cooled in the vacuum flange 12 and the vacuum evacuation pipe 13, thereby producing deposits on an inner wall of the vacuum evacuation pipe 13, as described before. These deposits are stirred up in the quartz tube 3 and may adhere as particles to surfaces of the silicon wafers 1 when the pressure in the quartz tube 3 is varied from atmospheric pressure to a reduced-pressure condition (vacuum) or vice versa when subsequently forming silicon oxide films on the silicon wafers 1.

A description will now be made of the cleaning operation for purging the deposits with anhydrous HF gas and the ClF₃ gas. In this Embodiment 1, the case of cleaning both the quartz tube 3 and the vacuum evacuation pipe 13 of the reduced-pressure CVD apparatus will be described.

First, to create a vacuum condition in the quartz tube 3 by the rotary pump 14, the vacuum evacuation main valve 15 having a large diameter is closed, but a vacuum evacuation sub-valve 16 having a small diameter is opened to gradually evacuate air from the interior of the quartz tube 3 to 20 Torr. When the vacuum level in the quartz tube 3 exceeds 20 Torr, the vacuum evacuation main valve 15 is also opened. When the vacuum meter 23 shows that the vacuum level in the quartz tube 3 reaches $10^{-3}$ Torr, the vacuum evacuation main valve 15 and the vacuum evacuation sub-valve 16 are both closed, but the valves 11 and 32 are both opened so that the nitrogen gas is introduced from the nitrogen gas supply source 9 to the quartz tube 3. During that process, the valve 33 and the valves 7, 21 and 22 for introducing the other gases are all kept closed.

When the pressure in the quartz tube 3 reaches 500 Torr, the vacuum evacuation sub-valve 16 is opened to make a fine adjustment so that the pressure in the quartz tube 3 is maintained at 500 Torr while the nitrogen gas is flowing through the quartz tube 3. Simultaneously, the temperature in the quartz tube 3 is held at 700° C. by the heater 14. The pressure adjustment may be performed by using a needle valve disposed upstream of the rotary pump 14 in combination with the vacuum evacuation main valve 15 and the vacuum evacuation sub-valve 16. As an alternative, another vacuum pump may be employed in combination with the rotary pump 14.

Under the condition that the pressure of the nitrogen gas in the quartz tube 3 is stabilized after continuous flowing of the nitrogen gas for 20 minutes while maintaining the pressure of the nitrogen gas at 500 Torr, the valves 21 and 22 are opened to introduce the anhydrous HF gas and the $ClF_3$ gas to the quartz tube 3, thereby cleaning the quartz tube 3, the vacuum flange 12 and the vacuum evacuation pipe 13. Flow rates of the anhydrous HF gas and the $ClF_3$ gas are controlled respectively by the mass controllers 19 and 20. For example, the total flow rate of the anhydrous HF gas and the $ClF_3$ gas is set to 1 liter/min, whereas the flow rate of the nitrogen gas is set to 4 liter/min. During the cleaning, the total pressure of the nitrogen gas, the anhydrous HF gas and the $ClF_3$ gas is preferably in the range of from 300 Torr to 700 Torr, more preferably from 500 Torr to 600 Torr. The cleaning operation is continued for, e.g., approximately 2 hours.

If the pressure in the quartz tube 3 is not greater than 300 Torr, the etching rate would be extremely low. To increase an etching rate to a satisfactory value for practical use, therefore, the total pressure must not be less than 300 Torr. Also, if the content of the anhydrous HF gas and the $ClF_3$ gas is too high, the pipes and so on would be corroded. It is therefore desirable that the above total pressure not be greater than 700 Torr. The total amount of the anhydrous HF gas and the $ClF_3$ gas mixed is preferably in the range of from 10% to 20% with respect to the nitrogen gas. Further, the $ClF_3$ gas is preferably mixed in the anhydrous HF gas at a ratio not greater than 5%. The etching rate of the deposits is approximately 1.5%/min for the conditions of the aforementioned flow rates, 700° C. and 500 Torr. The term "etching rate (%/min)" used herein is represented by [the weight (g) by which the sample weight is reduced by the etching/the sample weight (g) before the etching×100/etching time (minute)].

With the above cleaning operation, the deposits adhering to the inner wall of the vacuum evacuation pipe 13, e.g., $CH_{3.8}Si_2O_{1.7}$, are removed through the reaction expressed by $CH_{3.8}Si_2O_{1.7}+8HF \rightarrow CH_4+1.7H_2O+2SiF_4+2.2H_2$. Also, the deposits adhering to the inner wall of the quartz tube 3, e.g., $SiO_2$ are removed through the reaction expressed by $2SiO_2+4ClF_3 \rightarrow SiF_4+SiCl_4+4F_2+2O_2$. Additionally, the noxious gases, the anhydrous HF gas, etc. generated through the above reactions are recovered by the noxious gas recovering device 50.

As described above, the deposits adhering to the inner walls of the reaction chamber and the vacuum evacuation pipe can both be removed, and the cleaning effect can be increased by adding the $ClF_3$ gas to the anhydrous HF gas.

Embodiment 2

Figure 2:
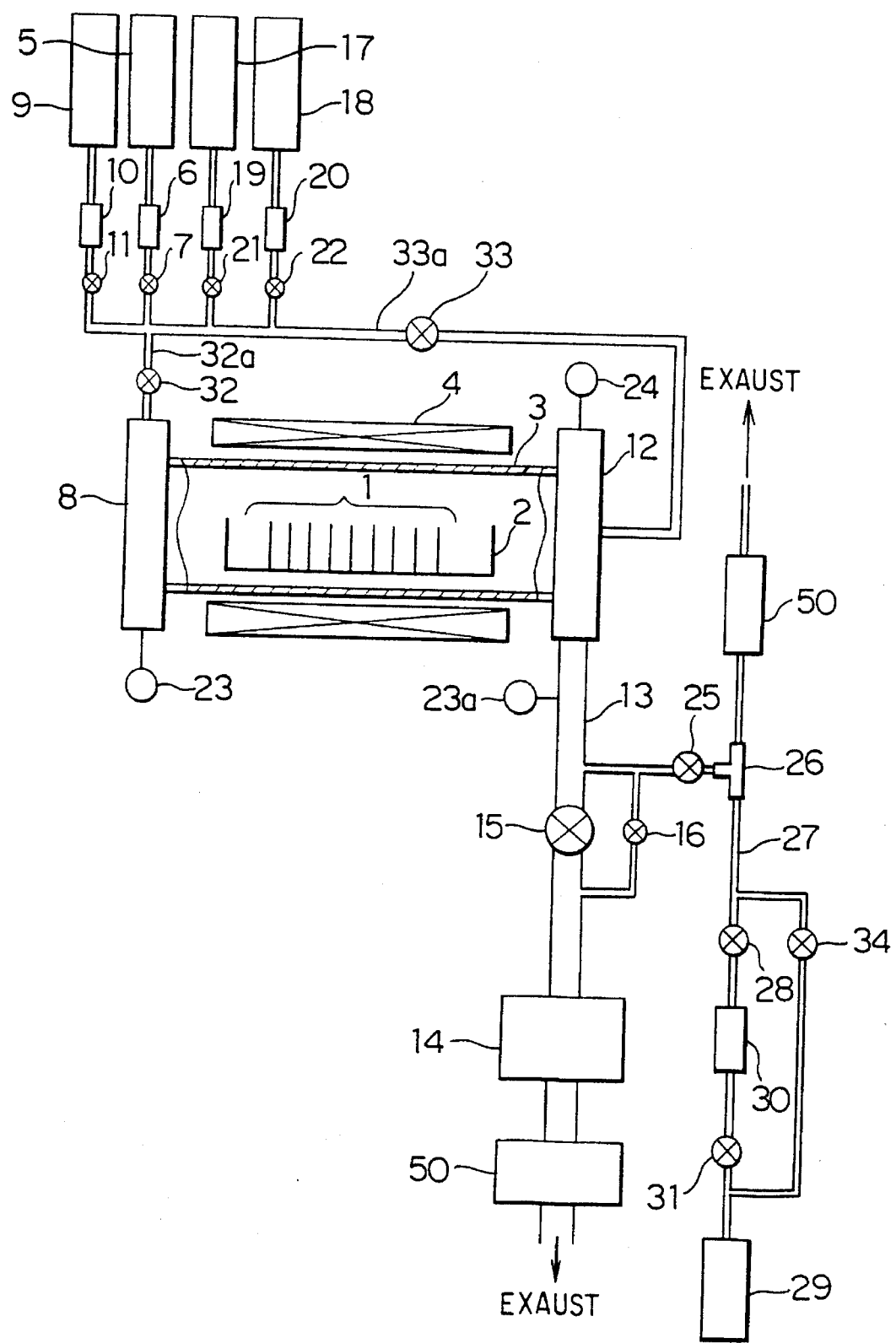
FIG. 2 is a block diagram showing a reduced-pressure CVD apparatus according to Embodiments 2 and 4 of the present invention.
Figure 3:
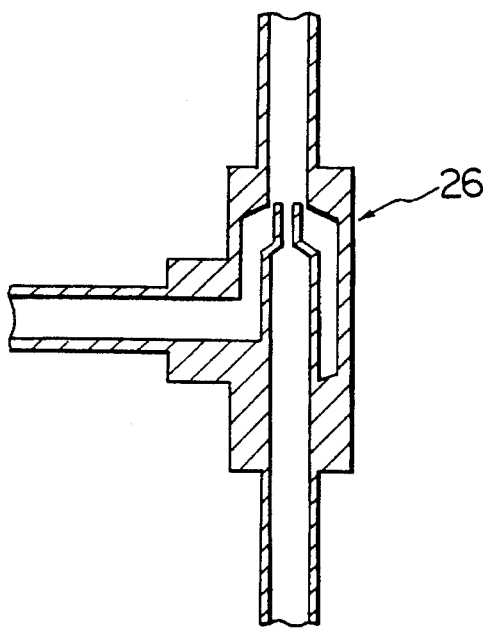
FIG. 3 is an enlarged sectional view showing an aspirator of the reduced-pressure CVD apparatus shown in FIG. 2.

FIG. 2 is a block diagram of a semiconductor device manufacturing apparatus, e.g., a reduced-pressure CVD apparatus, according to Embodiment 2 of the present invention. As seen from the figure, pressure reducing means, e.g., an aspirator 26, is connected in parallel with the vacuum evacuation pipe 13 through a valve 25. FIG. 3 shows the sectional structure of the aspirator 26 in an enlarged scale.

A pipe 27 is connected to the aspirator 26, and a nitrogen gas supply source 29 is connected to the pipe 27 through a valve 28. The flow rate of the nitrogen gas supplied to the aspirator 26 is controlled by a flow meter 30 and a regulator 31. Another noxious gas recovering device 50 for recovering noxious gases such as anhydrous HF gas is disposed downstream of the aspirator 26. Also connected to the pipe 27 is a valve 34 for supplying the nitrogen gas from the nitrogen gas supply source 29 directly to the aspirator 26 without passing the flow meter 30.

Both the quartz tube 3 and the vacuum evacuation pipe 13 of the reduced-pressure CVD apparatus are cleaned by using the pressure reducing means as follows.

First, to create a vacuum condition in the quartz tube 3 by the rotary pump 14, the vacuum evacuation main valve 15 and the valve 25 are closed, but the vacuum evacuation sub-valve 16 is opened to gradually evacuate air from the interior of the quartz tube 3 to 20 Torr. When the vacuum level in the quartz tube 3 exceeds 20 Torr, the vacuum evacuation main valve 15 is also opened. When the vacuum meter 23 shows that the vacuum level in the quartz tube 3 reaches $10^{-3}$ Torr, the vacuum evacuation main valve 15 and the vacuum evacuation sub-valve 16 are both closed, but the valves 11 and 32 are both opened so that the nitrogen gas is introduced from the nitrogen gas supply source 9 to the quartz tube 3. During that process, the valve 33 and the valves 7, 21 and 22 for introducing the other gases are all kept closed.

When the pressure in the quartz tube 3 reaches 500 Torr, the valves 25 and 28 are opened to introduce the nitrogen gas from the nitrogen gas supply source 29 to the pipe 27, whereupon the aspirator 26 is operated so as to maintain the pressure in the quartz tube 3 at 500 Torr while the nitrogen gas is flowing through the quartz tube 3. Simultaneously, the temperature in the quartz tube 3 is held at 700° C. by the heater 14.

When the pressure of the nitrogen gas in the quartz tube 3 is stabilized after continuously flowing the nitrogen gas for 20 minutes while maintaining the pressure of the nitrogen gas at 500 Torr, the valves 21 and 22 are opened to introduce the anhydrous HF gas and the $ClF_3$ gas to the quartz tube 3, thereby cleaning the quartz tube 3, the vacuum flange 12 and the vacuum evacuation pipe 13. Flow rates of the anhydrous HF gas and the $ClF_3$ gas are controlled respectively by the mass controllers 19 and 20. For example, the total flow rate of the anhydrous HF gas and the $ClF_3$ gas is set to 1 liter/min, whereas the flow rate of the nitrogen gas is set to 4 liter/min. During the cleaning, the total pressure of the nitrogen gas, the anhydrous HF gas and the $ClF_3$ gas is preferably in the range of from 300 Torr to 700 Torr, more preferably from 500 Torr to 600 Torr, as in Embodiment 1. The cleaning operation is continued for, e.g., approximately 2 hours.

With the above cleaning operation, the deposits adhering to the inner walls of the quartz tube 3 and the vacuum evacuation pipe 13 are removed similar to Embodiment 1. Further, the generated noxious gases are recovered by the noxious gas recovering device 50.

After the cleaning, the valves 21 and 22 are closed to stop the supply of the anhydrous HF gas and the $ClF_3$ gas, but the valve 11 is kept open to purge the remaining gases from the quartz tube 3 and the vacuum evacuation pipe 13 with the nitrogen gas at a pressure of 500 Torr. Then, the valve 28 is closed, but the valve 34 is opened. The nitrogen gas is thereby vigorously supplied directly to the aspirator 26 without passing through the flow meter 30, etc. so that the pressure in the quartz tube 3 is reduced to 50 Torr in a short time. After that, the valve 34 is closed to increase the pressure of the nitrogen gas in the quartz tube 3. When the pressure of the nitrogen gas reaches 600 Torr, the valve 34 is opened to reduce the pressure in the quartz tube 3 to 50 Torr again. The above process enables the remaining gases in the quartz tube 3 and the vacuum evacuation pipe 13 to be promptly replaced by the nitrogen gas.

Subsequently, the valves 11 and 34 are closed, but the vacuum evacuation main valve 15 is opened so that the pressure in the quartz tube 3 is reduced to $10^{-3}$ Torr by the rotary pump 14. After maintaining that condition for approximately 20 minutes, it is confirmed by the gas sensor 24 that the content of the anhydrous HF gas and the $ClF_3$ gas is not greater than 10 ppm. Then, the vacuum evacuation main valve 15 is closed, but the valve 11 is opened to introduce the nitrogen gas to the quartz tube 3 until reaching atmospheric pressure.

Figure 4:
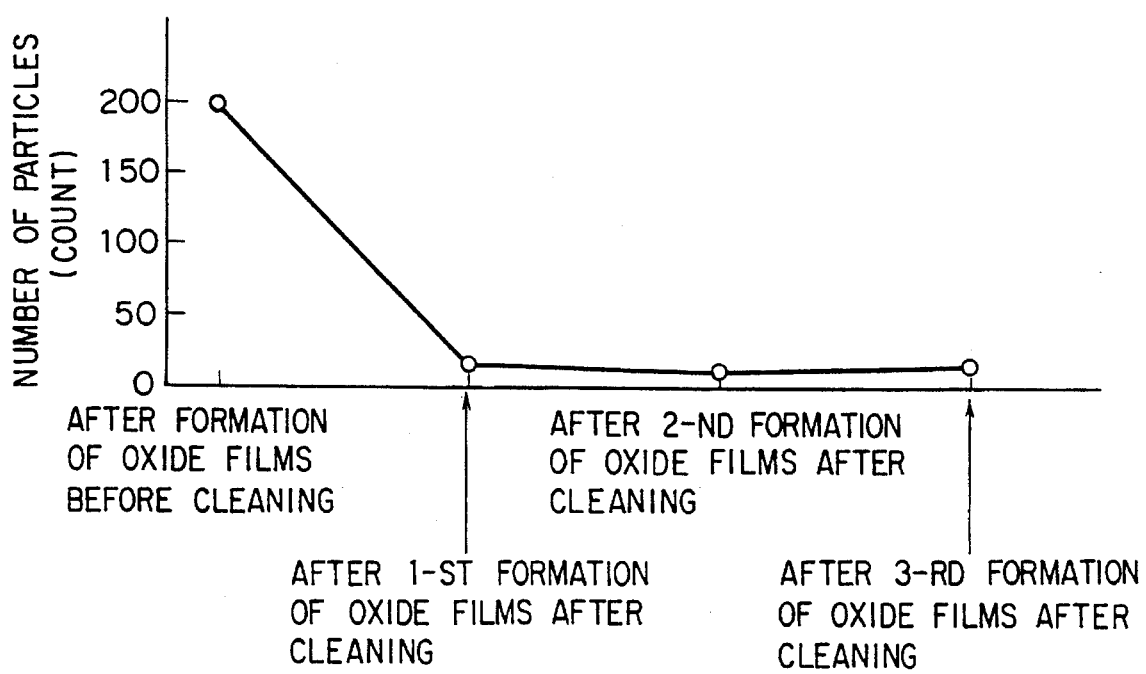
FIG. 4 is a graph showing the relationship between the number of times that oxide films are formed on silicon wafers after cleaning the reduced-pressure CVD apparatus in accordance with Embodiment 2 of the present invention and the number of particles adhering to surfaces of the silicon wafers.

Next, the batch process of forming oxide films on the silicon wafers 1 were repeated four times in total, and the number of particles adhering to the surfaces of the silicon wafers 1 and having a size not less than 0.3 μm was measured for each process. The measured results are shown in FIG. 4. When the oxide films were formed on the silicon wafers 1 without or before the cleaning, the number of particles was 200. However, when the oxide films were formed on the silicon wafers 1 after the cleaning, the number of particles adhering to the oxide films was 5 after the first formation, 3 after the second formation, and 4 after the third formation. Thus, the number of particles was reduced remarkably. This result is comparable to that obtained by the conventional cleaning using liquid chemicals.

Embodiment 3

The case of cleaning only the vacuum evacuation pipe 13 of the reduced-pressure CVD apparatus using the vacuum evacuation means will be described in this Embodiment.

First, referring to FIG. 1, the valves 15 and 16 are closed, but the valves 11 and 33 are opened to introduce the nitrogen gas from the nitrogen gas supply source 9 directly to the vacuum evacuation pipe 13. At this time, the valve 32 and the valves 7, 21 and 22 for introducing the other gases are all kept closed.

When the pressure of the nitrogen gas in the vacuum evacuation pipe 13 reaches 500 Torr, the vacuum evacuation sub-valve 16 is opened to make a fine adjustment so that the pressure in the vacuum evacuation pipe 13 is maintained at 500 Torr by the rotary pump 14 while the nitrogen gas is flowing through the pipe 13. The pressure adjustment may be performed in combination with a needle valve or another vacuum pump as with Embodiment 1. After that, the valves 21 and 22 are opened to flow the anhydrous HF gas and the $ClF_3$ gas through the vacuum evacuation pipe 13, thereby cleaning the vacuum evacuation pipe 13 at a the pressure of approximately 500 Torr.

After the cleaning, the valves 21 and 22 are closed to stop the supply of the anhydrous HF gas and the $ClF_3$ gas, and the remaining gases in the vacuum evacuation pipe 13 are purged with the nitrogen gas from the nitrogen gas supply source 9 at a pressure of 500 Torr, thereby ending the cleaning operation. The noxious gases flowing through the vacuum evacuation pipe 13 are recovered by the noxious gas recovering device 50. As described above, the vacuum evacuation pipe 13 to which deposits are more likely to adhere can be solely cleaned with priority.

Embodiment 4

The case of cleaning only the vacuum evacuation pipe 13 of the reduced-pressure CVD apparatus using the pressure reducing means will be described in this Embodiment.

First, referring to FIG. 2, the valves 15, and 16, 25 and 28 are closed, but the valves 11 and 33 are opened to introduce the nitrogen gas from the nitrogen gas supply source 9 directly to the vacuum evacuation pipe 13. At this time, the valve 32 and the valves 7, 21 and 22 for introducing the other gases are all kept closed.

When the pressure of the nitrogen gas in the vacuum evacuation pipe 13 reaches 500 Torr, the valves 25 and 28 are opened to introduce the nitrogen gas from the nitrogen gas supply source 29 to the pipe 27, whereupon the aspirator 26 is operated so as to maintain the pressure in the vacuum evacuation pipe 13 while the nitrogen gas is flowing through the pipe 13. After that, the valves 21 and 22 are opened to flow the anhydrous HF gas and the $ClF_3$ gas through the vacuum evacuation pipe 13, thereby cleaning the vacuum evacuation pipe 13 at a pressure of approximately 500 Torr.

After the cleaning, the valves 21 and 22 are closed to stop the supply of the anhydrous HF gas and the $ClF_3$ gas, and the remaining gases in the vacuum evacuation pipe 13 are purged by the nitrogen gas from the nitrogen gas supply source 9 at a pressure of 500 Torr, thereby ending the cleaning operation. The noxious gases flowing through the vacuum evacuation pipe 13 are recovered by the noxious gas recovering device 50. As described above, the vacuum evacuation pipe 13 to which deposits are more likely to adhere can be solely cleaned with priority.

Embodiment 5

Figure 5:
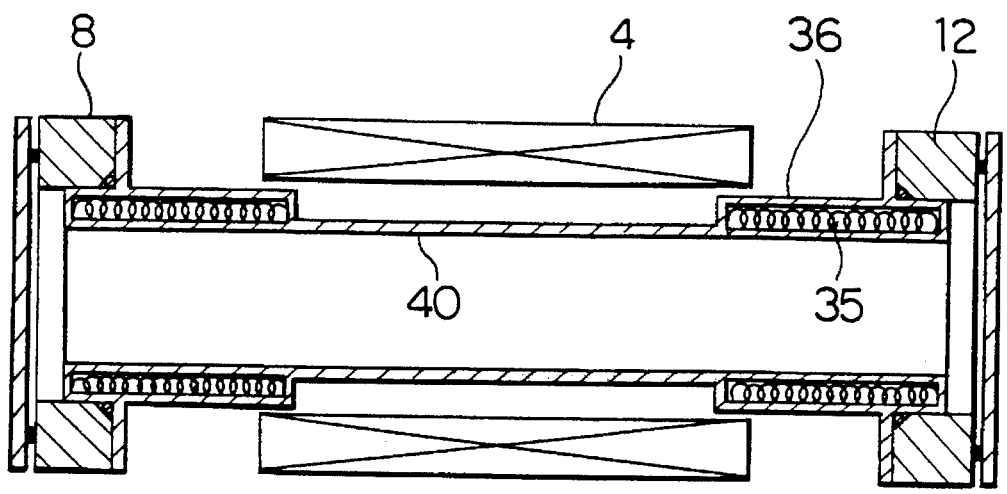
FIG. 5 is a side sectional view showing a quartz tube of the reduced-pressure CVD apparatus according to Embodiment 5 of the present invention.
Figure 6:
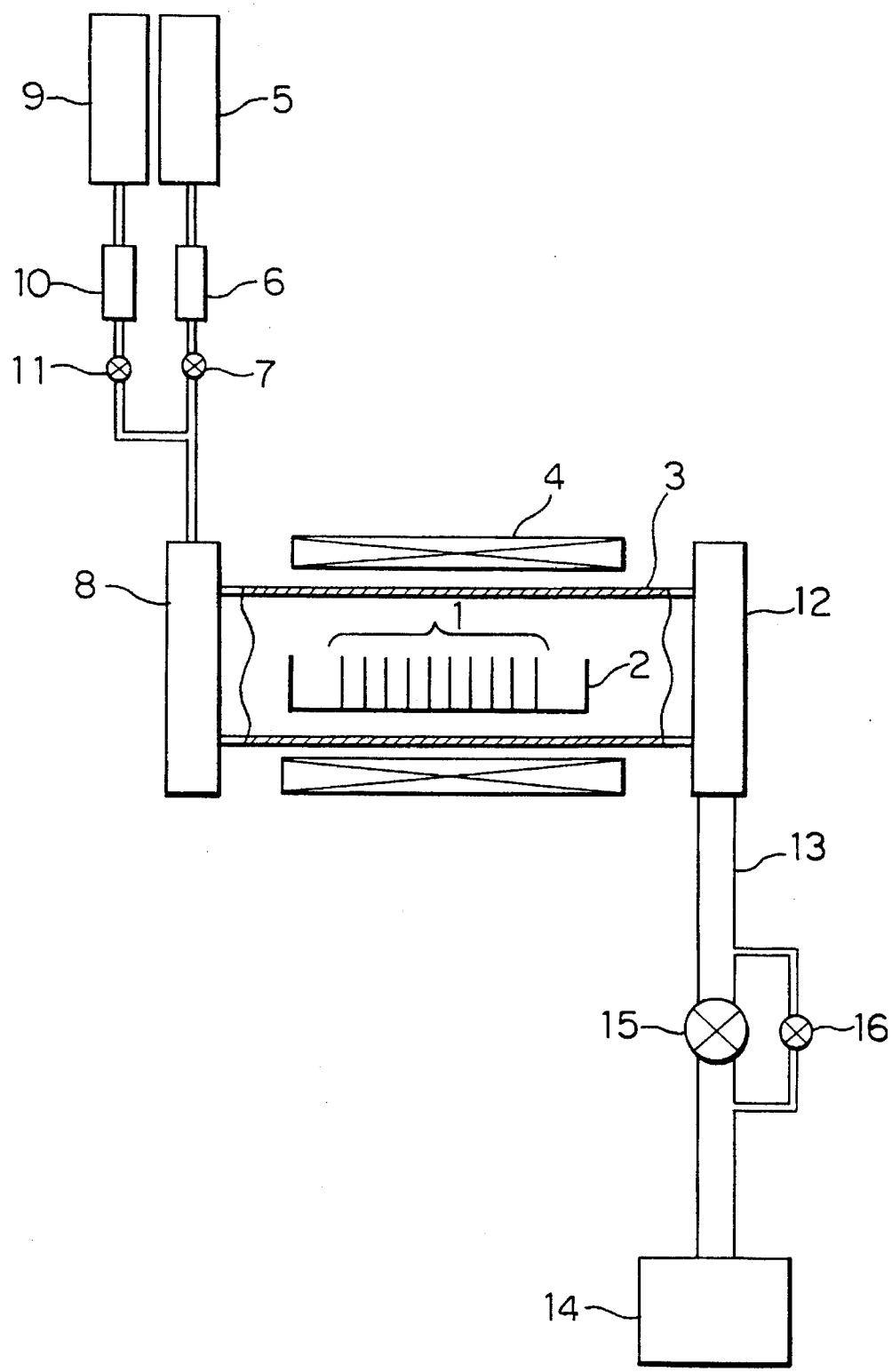
FIG. 6 is a block diagram showing a conventional reduced-pressure CVD apparatus.

In above Embodiments of FIGS. 1 and 2, since the quartz tube 3 is longer than the heater zone where the heater 4 is arranged, the temperature at the end portions of the quartz tube 3 near the vacuum flanges 8 and 12 is reduced and deposits are more apt to adhere to the tube's inner wall in those end portions. To avoid such a drawback, as shown in FIG. 5, the quartz tube 3 for use in the semiconductor device manufacturing apparatus can be modified to have vacuum chambers 35 in both end portions.

By forming the vacuum chambers 35, both end portions of a resultant quartz tube 40 have improved thermal insulation effective in maintaining a higher temperature and, as a result, adhering of deposits can be prevented to the extent possible. Additionally, quartz wool 36, for example, may be packed in the vacuum chambers 35 for increasing the thermal capacity of tube portions including the vacuum chambers 35.

According to the present invention, as described hereinabove, a semiconductor device manufacturing apparatus is provided that does not require disassembling a vacuum evacuation pipe and separate cleaning that can remove deposits adhering to inner walls of a reaction chamber and the vacuum evacuation pipe so that particles attributable to the deposits are prevented from adhering to semiconductor wafers during the formation of silicon oxide films, and hence can manufacture semiconductor devices with high reliability.

Also, since pressure reducing means for creating a predetermined reduced-pressure condition in the reaction chamber and the vacuum evacuation pipe is provided in the semiconductor device manufacturing apparatus, gas pressure in the reaction chamber or the vacuum evacuation pipe can be easily adjusted when cleaning the semiconductor device manufacturing apparatus. In addition, the remaining gases in the reaction chamber and the vacuum evacuation pipe can be promptly purged with nitrogen gas.

Further, since anhydrous HF gas, an interhalogen compound gas and a carrier gas are introduced to the reaction chamber for accommodating semiconductor wafers or the vacuum evacuation pipe connected to the reaction chamber, thereby removing deposits produced by reactive gas and adhering to an inner wall of the reaction chamber or the vacuum evacuation pipe, the vacuum evacuation pipe to which deposits are more likely to adhere can be solely cleaned with priority. It is thus possible to efficiently clean the semiconductor device manufacturing apparatus, remove deposits adhering to the inner wall of the reaction chamber or the vacuum evacuation pipe so that particles attributable to the deposits are prevented from adhering to semiconductor wafers during the formation of silicon oxide films, and to manufacture semiconductor devices with high reliability.

Moreover, with the present method of cleaning the semiconductor device manufacturing apparatus, since the anhydrous HF gas, the interhalogen compound gas and the carrier gas are introduced Lo the reaction chamber or the vacuum evacuation pipe under a pressure in the range of from 300 Torr to 700 Torr, the etching rate of the deposits adhering to the inner wall of the reaction chamber or the vacuum evacuation pipe can be increased to perform the cleaning operation promptly.

What is claimed is:

1. A semiconductor device manufacturing apparatus comprising:
    a reaction chamber for accommodating semiconductor wafers,
    reactive gas introducing means connected to said reaction chamber for introducing reactive gas to said reaction chamber,
    a vacuum evacuation pipe connected to said reaction chamber,
    vacuum evacuation means connected to said vacuum evacuation pipe for evacuating said reaction chamber and said vacuum evacuation pipe,
    anhydrous HF gas introducing means connected to at least one of said reaction chamber and said vacuum evacuation pipe for introducing anhydrous HF gas,
    interhalogen compound gas introducing means connected to at least one of said reaction chamber and said vacuum evacuation pipe for introducing an interhalogen compound gas, and
    carrier gas introducing means connected to at least one of said reaction chamber and said vacuum evacuation pipe for introducing carrier gas.

2. The apparatus according to claim 1 including pressure reducing means for creating a reduced-pressure condition in said reaction chamber wherein said vacuum evacuation pipe is connected in parallel with said vacuum evacuation pipe.

3. A method of cleaning a semiconductor device manufacturing apparatus wherein anhydrous HF gas, an interhalogen compound gas, and a carrier gas are introduced to at least one of a reaction chamber for accommodating semiconductor wafers and a vacuum evacuation pipe connected to said reaction chamber, thereby removing deposits produced by a reactive gas and adhering to an inner wall of said reaction chamber and said vacuum evacuation pipe.

4. The method according to claim 3 including introducing the anhydrous HF gas, the interhalogen compound gas, and the carrier gas to at least one of said reaction chamber and said vacuum evacuation pipe at a pressure in the range of from 300 Torr to 700 Torr.

5. A semiconductor device manufacturing apparatus comprising:
    a reaction chamber for accommodating semiconductor wafers,
    reactive gas introducing means connected to said reaction chamber for introducing reactive gas to said reaction chamber,
    a vacuum evacuation pipe connected to said reaction chamber,
    vacuum evacuation means connected to said vacuum evacuation pipe for evacuating said reaction chamber and vacuum evacuation pipe,
    anhydrous HF gas introducing means connected to both of said reaction chamber and said vacuum evacuation pipe for introducing anhydrous HF gas,
    interhalogen compound gas introducing means connected to both of said reaction chamber and said vacuum evacuation pipe for introducing an interhalogen compound gas to said reaction chamber and said vacuum evacuation pipe, and
    carrier gas introducing means connected to at least one of said reaction chamber and said vacuum evacuation pipe for introducing carrier gas to said reaction chamber and said vacuum evacuation pipe.

* * * * *